United States Patent [19]

Carbou et al.

[11] Patent Number: 5,438,291

[45] Date of Patent: Aug. 1, 1995

[54] CONTROLLED DELAY DIGITAL CLOCK SIGNAL GENERATOR

[75] Inventors: Pierre Carbou, Vence; Pascal Guignon, Callian Fayence, both of France

[73] Assignee: Texas Instruments Incorporated, Dallas, Tex.

[21] Appl. No.: 168,707

[22] Filed: Dec. 16, 1993

[51] Int. Cl.⁶ .............................................. H03K 5/12
[52] U.S. Cl. .................................. 327/170; 327/172; 327/131; 327/134; 327/269
[58] Field of Search ............... 307/261, 262, 263, 268, 307/228, 597, 602, 603; 328/36, 55, 155; 327/131-134, 137, 170, 172, 269, 270

[56] References Cited

U.S. PATENT DOCUMENTS

| | | | | |
|---|---|---|---|---|
| 4,117,757 | 10/1978 | Akamatu | ............................. | 307/261 |
| 4,124,821 | 11/1978 | Petr | ..................................... | 307/261 |
| 4,277,753 | 7/1981 | Faulkner | ............................. | 328/155 |
| 4,839,788 | 6/1989 | Tullsen | ............................... | 307/261 |
| 5,045,800 | 9/1991 | Kung | .................................... | 307/261 |
| 5,140,591 | 8/1992 | Palara et al. | ......................... | 307/261 |

Primary Examiner—Timothy P. Callahan
Assistant Examiner—T. T. Lam
Attorney, Agent, or Firm—Dana L. Burton; James C. Kesterson; Richard L. Donaldson

[57] ABSTRACT

Controlled delay digital clock signal generator, characterised in that it comprises means (I5, I6, I7, I8, I9, I10, IT7, IT8, IT9, IT10, C4) to generate from a clock signal (CK) and its complementary signal (CKB) a ramp signal comprising at least two segments of positive slope and at least two segments of negative slope, means (I1, I2, IT1, IT2, IT3, C2, CET1T2, AMPLI, I3, I4, IT4, IT5, IT6, C3, CET3T4, AMPL2) for separate control of the slopes of the said segments, means with trigger circuits (AMPL0) for converting the ramp signal (RAMP) into a square signal (CKQ) means (NO0, A0, A1, NO1) for achieving the logic combinations of the delayed square clock signal (CKQ) resulting from the conversion with the clock signal (CK) and the clock complementary clock signal (CKB) of the said clock signal to obtain as many delayed digital clock signals as the ramp signal has segments of different slopes.

8 Claims, 8 Drawing Sheets

CONTROLLED DELAY DIGITAL CLOCK SIGNAL GENERATOR

The present invention relates to analog phase shifters and more particularly to phase shifters for the production of delayed controlled digital clock signals.

One aim of the present invention is to produce a circuit able to generate several clock signals for a digital circuit from a single clock input signal.

Another aim is to generate clock signals with a predetermined phase relation and clock signals having values of multiples of two of the system clock input signal.

Its object is therefore a digital generator of controlled delay clock signals, characterised in that it has means to generate, from a clock signal and its complementary signal, a ramp signal comprising at least two segments of positive slope and at least two segments of negative slope, means of separate control of the slopes of the said segments, means of trigger circuits for converting the signal in ramp form into a square delayed clock signal, means to achieve the logic combinations of the square signal resulting from the conversion with the clock signal and the complementary clock signal of the said clock signal in order to obtain as many delayed digital clock signals as the ramp signal has segments of different slopes.

According to one characteristic of the invention, the means to generate the ramp signal comprise first, second, third and fourth current sources connected two by two in series between the supply voltage and earth with, interposed between the first and the third current sources and between the second the fourth current sources connected in series, switches controlled respectively by generator output clock signals and connected by their terminals opposite the current sources to a condenser, the said first and second sources and the said third and fourth sources being controlled respectively by differential amplifier outputs, one input of which receives a reference voltage and the other input of which is connected to an error voltage integration condenser resulting from the difference between the charge time of another condenser connected firstly to the supply voltage via a switch activated by the generator output clock signal corresponding to a first segment of positive slope and a first segment of negative slope of the ramp signal, and secondly to earth via a switch activated by the generator clock output signal corresponding to a second segment of positive slope and a second segment of negative slope of the ramp signal, where the integration condenser is connected to the other condenser via a switch controlled by the said clock signal and its complementary signal.

According to other characteristics of the invention:
the generator also comprises means of stabilisation of the delayed clock signal issued by the circuit for converting the ramp signal into a square signal, means of detection of the values of the high and low peaks of the ramp signal, means of comparison of the values of the high and low peaks with high and low reference voltages and for production of error signals for correction of the control of the current sources connected between the supply voltage and earth, respectively before and after the means of generating the ramp signal;
means for achieving the logic combinations of square signals resulting from the conversion with the clock signals and the complementary clock signals which comprise two AND gates connected by one of their inputs to the output of the amplifier for conversion of the ramp signal into a square signal and by their other input to the clock signal and the complementary clock signal respectively, and two NOT-OR gates connected by one of their inputs to the output of the amplifier for converting the ramp signal into a square signal and by their other input to the complementary clock signal and the clock signal respectively:
the means of detection of the peak values of the ramp signal comprise a peak detector produced from a switched capacity circuit and the reference voltage is created by a switched capacity generator;
the condenser of the ramp signal generator is connected in parallel to the amplifier for conversion of the ramp signal into a square signal.

The invention will be better understood from the description which follows, given solely as an example and referring to the attached drawings on which.

Figure 1:
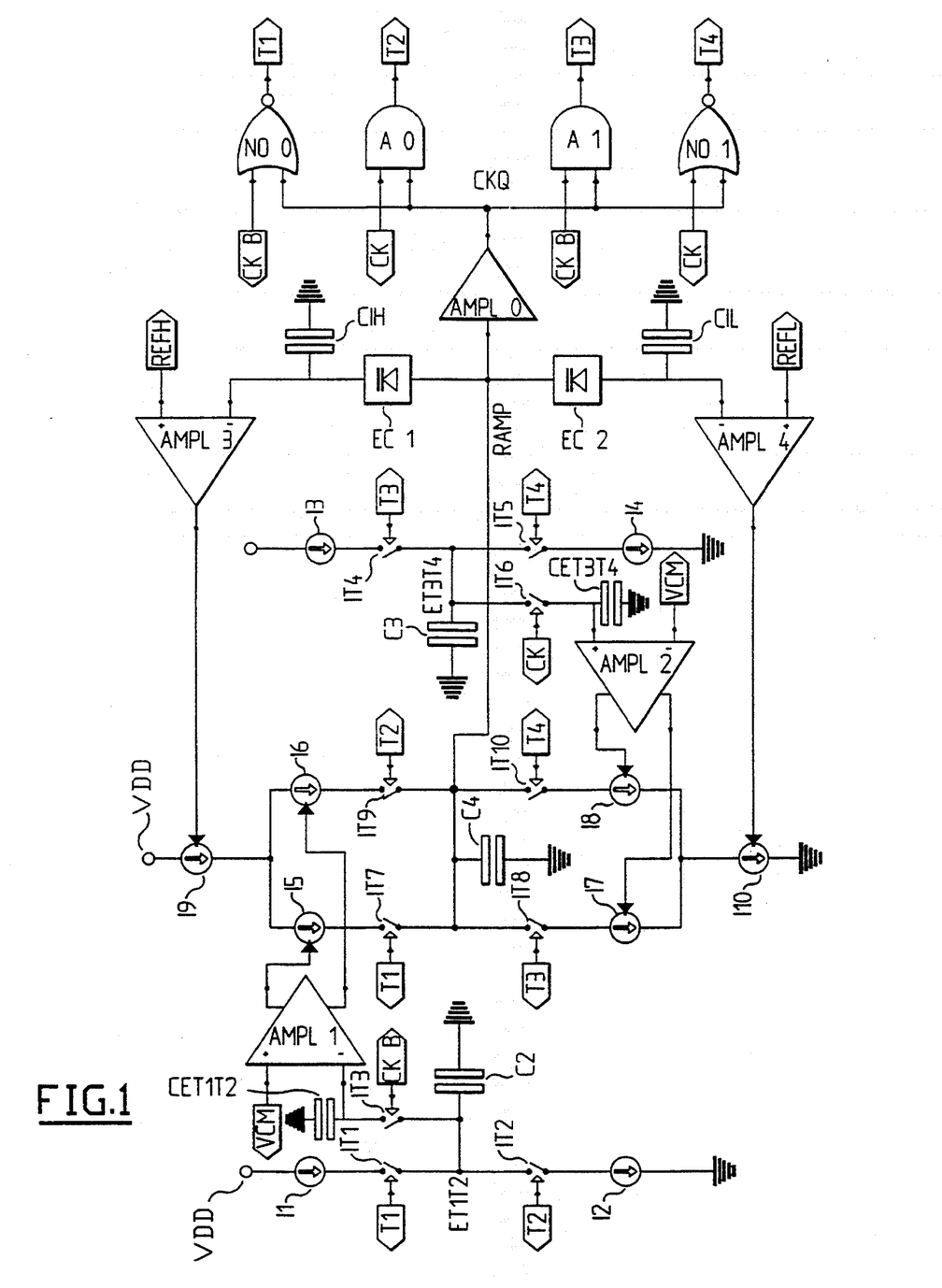
FIG. 1 shows a circuit designed to generate a delayed signal from a reference clock signal.

The aim of the circuit shown in FIG. 1 is to generate a delayed signal from a reference clock signal. This circuit is intended to behave as a phase locking loop without voltage-controlled oscillator. The delay generated between the input and output signals is controlled by two loops.

The principle of the invention is to generate a triangular wave form, the amplitude of which is controlled by a first loop. This triangular wave form consists of four segments, two with positive slope and two with negative slope, the slope of each of these being controlled separately by a control loop. The delayed signal is generated by converting the triangular wave form into a square wave using a trigger circuit.

Figure 2:
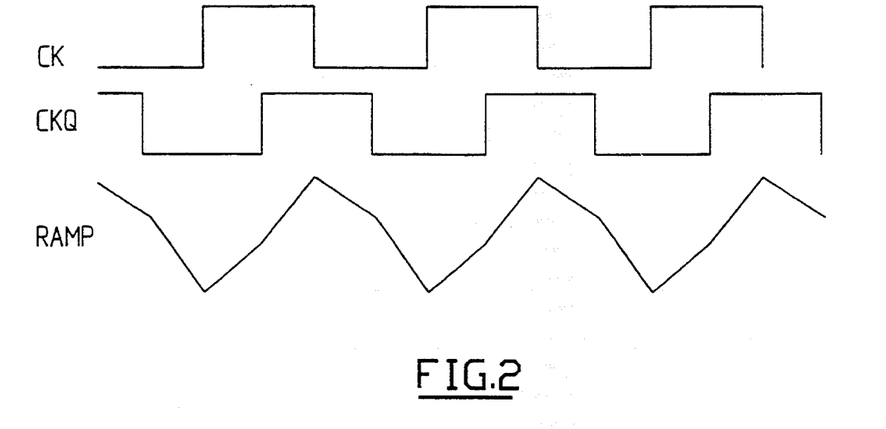
FIG. 2 is a diagram as a function of time of the signals obtained by a first loop of the circuit in FIG. 1.

The shape of the input signal CK, the shape of the triangular ramp signal and the delayed output clock signal CKQ are shown in FIG. 2.

The first method of design of the circuit according to the invention is shown in FIG. 1.

This circuit comprises principally a first current source I1 connected in series with a second current source I2 between the supply voltage of the circuit and earth, and interposed therein two switches IT1, IT2 controlled by the circuit output signals T1 and T2 respectively.

At the junction point of switches IT1 and IT2 is connected an integration condenser CET1T2 via a switch IT3 controlled by signal CKB and also connected to earth.

Another condenser C2 links the junction point of switches IT1 and IT2 to earth.

Condenser CET1T2 is connected to the negative input of a differential amplifier AMPL1, the positive input of which is connected to a common mode signal VCM.

A circuit similar to that just described is achieved by means of a third and a fourth current source I3, I4, switches IT4, IT5, IT6, condensers CET3T4 and C3, and a differential amplifier AMPL2.

Switches IT4 and IT5 are controlled by the output signals T3, T4 respectively, while switch IT6 is controlled by the clock signal CK.

The outputs of amplifiers AMPL1 and AMPL2 control current sources I5, I6 and I7, I8 respectively.

Sources I5 and I7 are connected in series and interposed therein switches IT7, IT8 controlled by circuit output signals T1 and T3.

Sources I6 and I8 are connected in series and interposed therein switches IT9, IT10 controlled by circuit output signals T2, T4 respectively.

Sources I5 and I6 are connected to the supply voltage VDD via a current source I9, whereas sources I7 and I8 are connected to earth via a current source I10.

The junction points of switches IT7, IT8 and IT9, IT10 are connected to a terminal of condenser C4, the other terminal of which is connected to earth.

The circuit just described constitutes a generator of a ramp signal with segments of different slopes. In the present example, the ramp signal has two segments of positive slope and two of negative slope (FIG. 2).

Condenser C4 is also connected to the input of an amplifier AMPL0, the output of which gives a delayed clock signal CKQ.

Condenser C4 is also connected to a peak detector EC1, the output of which is linked to an input of a differential amplifier AMPL3. The other input of this amplifier receives a high reference signal REFH.

The output of amplifier AMPL3 controls current source I9.

A condenser CIH is connected between the peak detector EC1 and earth.

In the same way, condenser C4 is connected to a differential amplifier AMPL4 which controls current source I10 by means of a peak detector EC2 connected to an input of amplifier AMPL4, a condenser CIL being connected between the peak detector and earth, the other input of amplifier AMPL4 being connected to a low reference signal REFL.

The output of amplifier AMPL0 which gives output signals CKQ is connected to the first inputs of two NOT-OR gates, NO0 and NO1, and two AND gates A0 and A1.

The second input of the NOT-OR gate NO0 receives the clock signal CKB whereas the second input of the NOT-OR gate NO1 receives the clock signal CK.

The second inputs of the AND gates A0 and A1 receive signals CK and CKB respectively.

The outputs of gates NO0, A0, A1, NO1 produce respectively signals T1, T2, T3 and T4.

The triangular wave form known as RAMP is created by the four current sources I5, I6, I7 and I8 and condenser C4. Each current source is switched separately by signals T1, T2, T3 and T4 which represent the four logic combinations of the input clock signal CK and its complementary CKB with the delayed output signal CKQ.

Signal CKQ is obtained by transforming the RAMP signal into a square signal by means of amplifier AMPL0.

The logic combinations of signal CK and CKQ are produced by the logic gates NO0, A0, A1, NO1.

Signal CKB is obtained by logic inversion of clock signal CK. The NOT-OR function between the signals CKB and CKQ is provided by the gate NO0 to generate signal T1 shown in FIG. 3.

Figure 3:
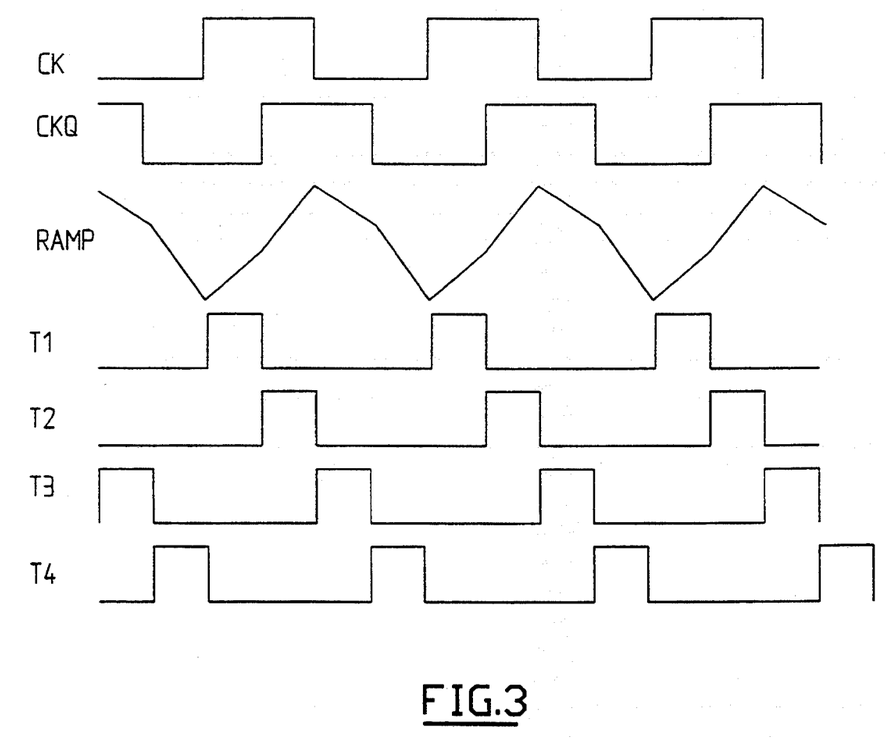
FIG. 3 is a diagram as a function of time showing the three signals of FIG. 2 and four clock signals dephased in relation to each other obtained by the circuit in FIG. 1.

The AND function between signals CK and CKQ is performed by the gate A0 to generate signal T2 in FIG. 3, "the AND" function between signals CKB and CKQ is performed by gate A1 to generate signal T3 and the NOT-OR function between signals CK and CKQ is performed by gate NO1 to generate signal T4 in FIG. 3.

The slope of each segment forming the RAMP signal depends on the duration of signals T1, T2, T3 and T4 and on the value of the currents from sources I5 to I8 of the ramp signal generator.

Signals T1 and I5 define the first increasing segment;
Signals T2 and I6 define the second increasing segment;
Signals T2 and I7 define the first decreasing segment;
Signals T4 and I8 define the second decreasing segment.

FIG. 3 shows the wave forms and the relations between the signals described above. When signal T1 is equal to signal T2 and signal T3 is equal to signal T4, the clock signals CK and CKQ are square.

By measuring the difference in duration between signals T1 and T2 and between signals T3 and T4, an error signal can be generated to control the value of current I5 in relation to I6 and that of current I7 in relation to I8 to reduce the duration errors of a minimum.

This error calculation between signals T1 and T2 is carried out using current sources I1 and I2 switched respectively by signals T1 and T2 and switches IT1, IT2 and by condenser C2. During signal T1 causing the closure of switch IT1, condenser C2 is charged with a current I0 and during the presence of signal T2 causing the closure of switch IT2, the same condenser C2 is discharged with a current I0.

If T1 and T2 are of the same duration, the variation in charge of the condenser C2 is equal to 0 at the end of sequence T1, T2. Otherwise an error voltage appears at the terminals of condenser C2.

This error voltage known as ET1T2 is then integrated into condenser CET1T2 via a switch IT3 controlled by signal CKB. The integrated error signal controls the positive input of the amplifier AMPL1 with differential inputs and differential outputs. The outputs of this amplifier are used to control the relative value of current sources I5 and I6 in order to reduce the difference in duration between signals T1 and T2. The positive input of amplifier AMPL1 is connected to a common mode voltage VCM.

Similarly, the error calculation between signals T3 and T4 is carried out by sources I3 and I4 switched respectively by signals T3 and T4 and the condenser CET3T4 and switch IT6 controlled by the clock input signal CK and connecting condenser C3 to amplifier AMPL2.

Figure 4:
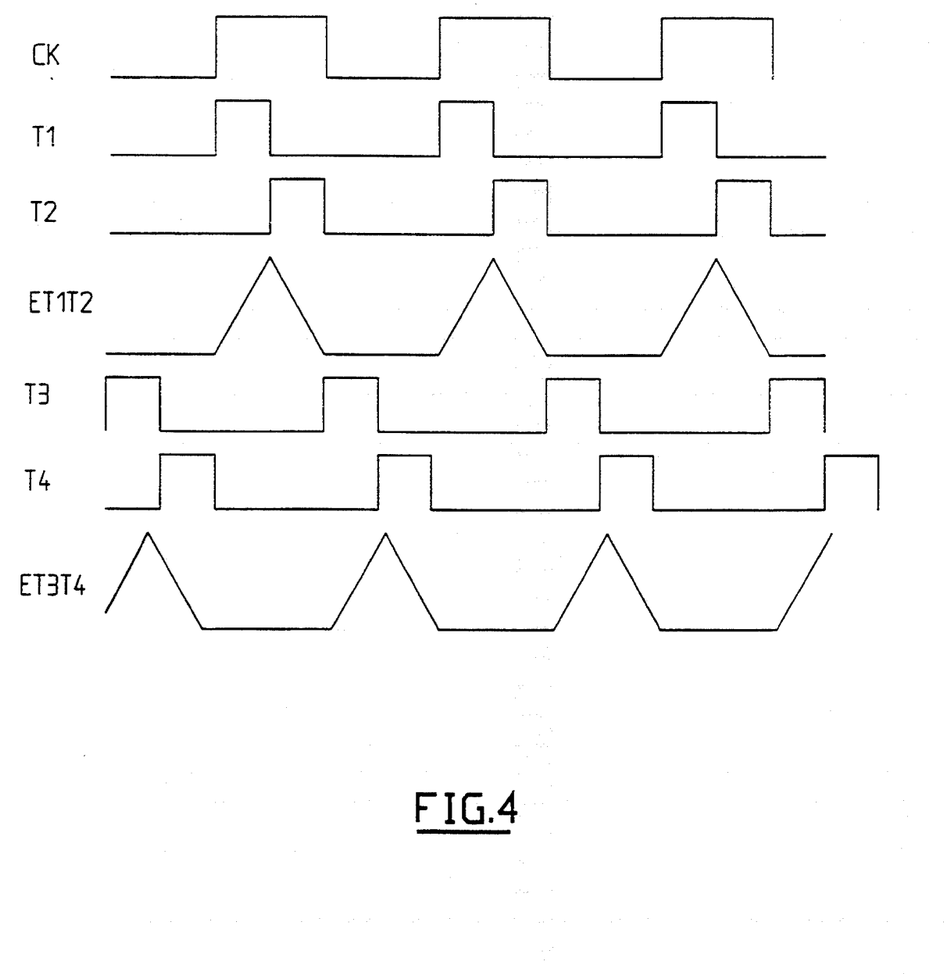
FIG. 4 shows the wave shape and the chronomogram of evaluation of the error signal.

FIG. 4 shows the wave form and chronomogram of evaluation of the error signal.

In the description above, the error signal is equal to 0 when signals CK and CKQ are square. By selecting different values for the charge and discharge currents, the error calculation is degenerated and the resulting phase shift may differ from 90°. This property is useful for generating clock signals with any phase shift.

Figure 5:
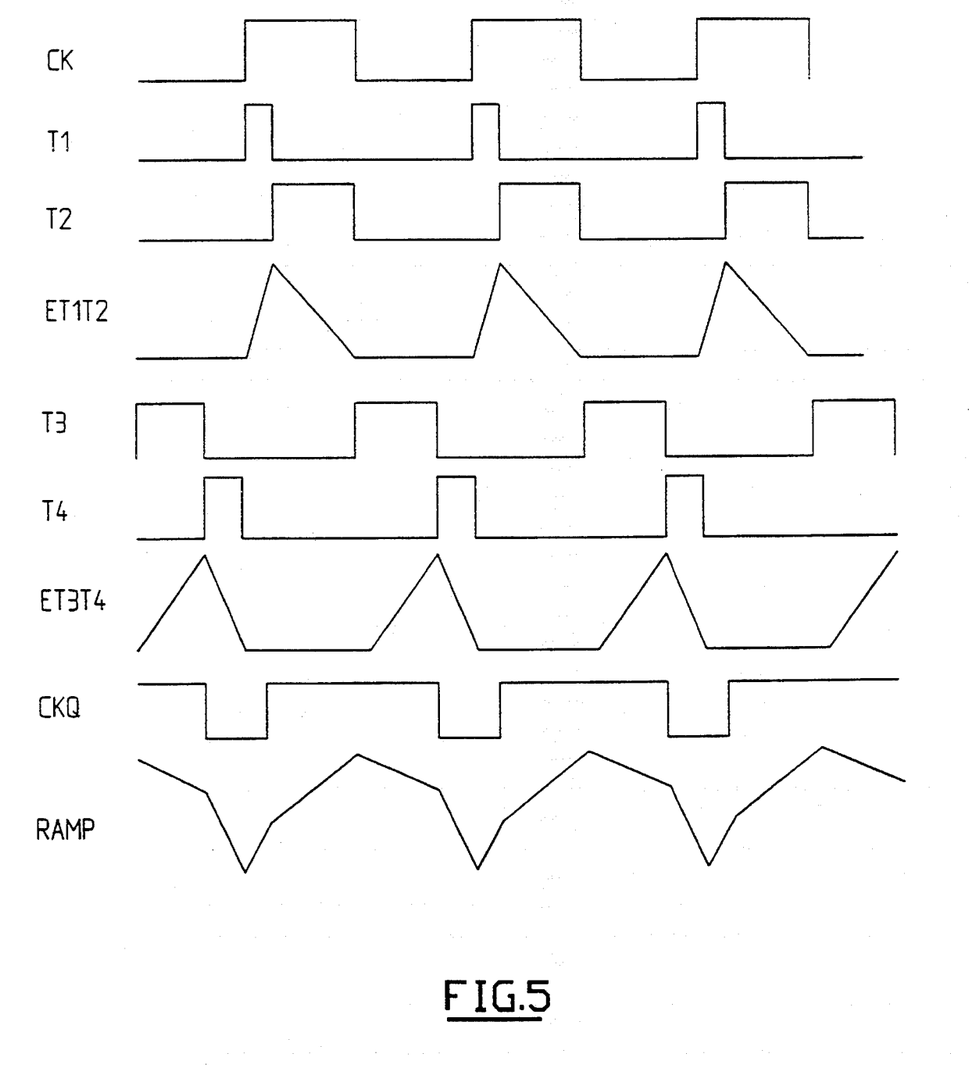
FIG. 5 shows the forms of the input and output clock wave with another ratio between the charge and discharge currents of a first condenser with a different charge and discharge current for a second condenser of the circuit in FIG. 1.

FIG. 5 shows the forms of waves CK and CKQ with another ratio between the charge and discharge currents of condenser C2 and with different charge and discharge currents of condenser C3.

Because retarded signal CKQ is generated by transforming into a square signal the triangular RAMP wave form, the decision threshold is affected by noise and induces instability into the delayed clock signal.

In order to reduce this phenomenon to a minimum, the amplitude of the triangular RAMP signal wave formsignal is optimised in relation to the supply voltage in order to obtain a maximum amplitude which allows an increase in the signal/noise ratio and hence a reduction in instability over a wide range of supply voltages.

The amplitude control circuit AMPL3, AMPL4 compares the high peak value of the ramp signal to a reference signal at REFH and the low peak value to a low level reference signal REFL.

The peak measurement circuit constituted by the detector EC1 stores the high peak value in the condenser CIH. The error amplifier AMPL3 measures the difference between the voltage at the terminals of condenser CIH and the reference voltage REFH, and uses this error signal to control the mean value of the charge current of condenser C4 by means of current source I9 (if there is no duration error I5=I9 and I6=I9, and if there is an error I5=I9+Ep, I6=I9−Ep). The same system is used to control the low peak value of the RAMP signal by means of a peak measurement circuit constituted by detector EC2, error amplifier AMPL4, a reference threshold REFL and current source I10, and mean values of I7 and I8. To optimise the amplitude of the triangular signal in relation to the supply voltage VDD, reference voltages are created from this supply voltage by a voltage division device which can be implemented by means of resistors or MOS devices the substrate of which is connected to the source.

The first design has the disadvantage of being dependent on the coefficient of voltage of the resistors available in CMOS technology.

Figure 6:
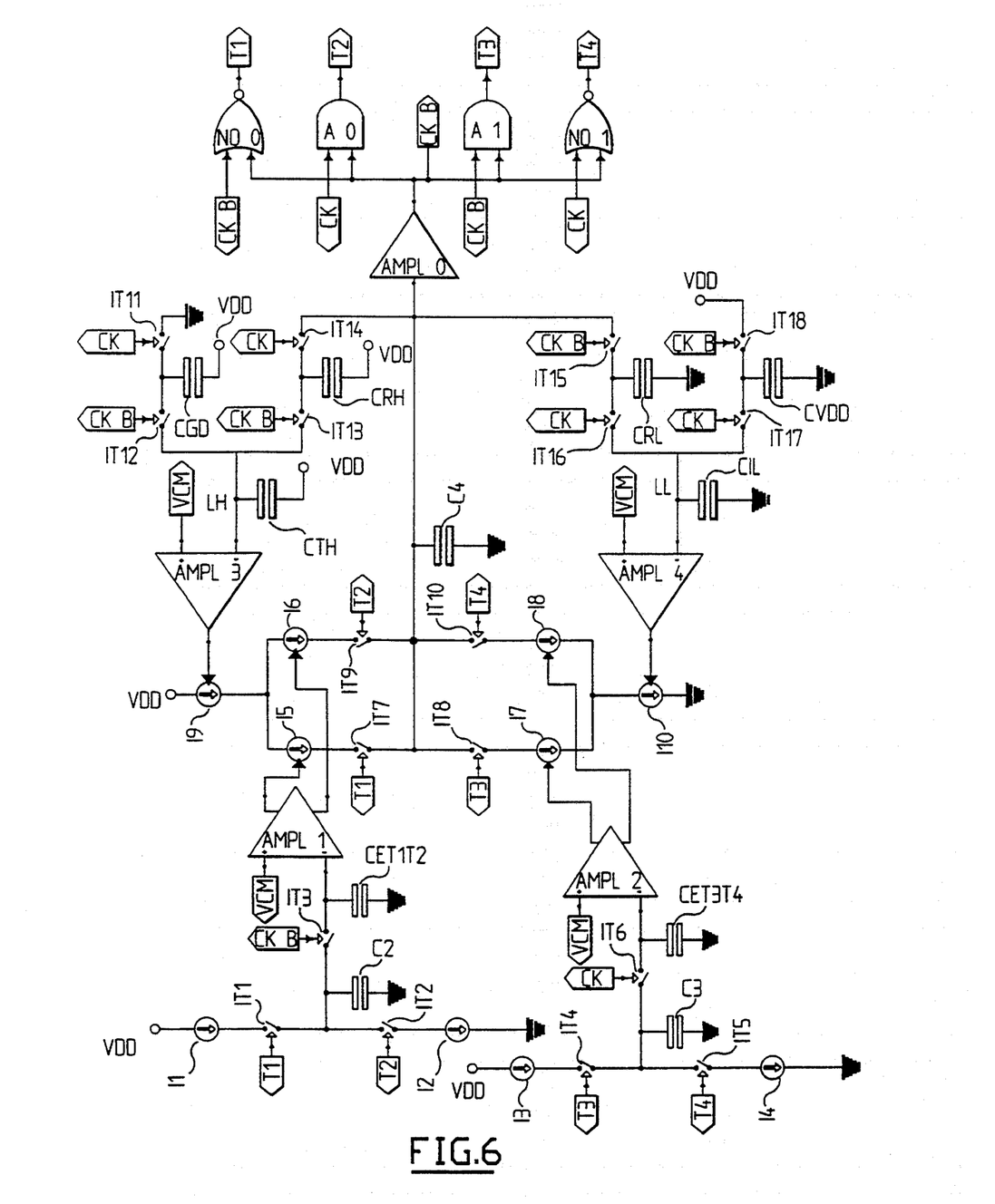
FIG. 6 is a very detailed electrical diagram showing the use of the phase shift circuit of FIG. 1.

The second design is more accurate but does not allow a low supply voltage because of the threshold voltage of the MOS devices. To avoid these disadvantages of the above designs, the peak detector and the reference voltage generator are produced using a circuit with switched capacity as shown in FIG. 6, which otherwise represents a circuit similar to that in FIG. 3.

The high peak detection circuit is formed by condenser CRH, switches IT11 to IT14 and amplifier AMPL3. Condenser CRH is connected between the RAMP signal and voltage VDD via switch T14 controlled by clock signal CK. The condenser CGD which forms part of the reference voltage generator is itself connected to earth via the switch IT11 and directly to voltage VDD. Throughout the duration of signals CKB, condensers CRH and CGD are both connected to condenser CIH through switches IT12 and IT13.

The result of this operation is compared with a common mode voltage VCM regulated at VDD/2 for example and the error voltage controls the value of the mean load current I9 of condenser C4.

The same system is used to control the low peak amplitude of the ramp signal by means of condenser CRL and CVDD, and switches IT15, IT16 and IT17 and IT18 controlled by signals CKB, CK, CK and CKB respectively.

Amplifier AMPL4 performs the error calculation and control source I10 which supplies a current equal to the mean current of I7 and I8 which controls the negative slopes of the triangular ramp signal.

A second design of the invention will now be described with reference to FIG. 7. With regard to the ramp signal generator, this is similar to the corresponding circuit in FIG. 6 with the exception of the connection of condenser C4.

This structure improves the performance by reducing the sensitivity of the system to parasite elements. In this second design, condenser C4 is connected as a reaction condenser to amplifier AMPL0, the output of which is connected to the corresponding inputs of gates NO0, A0, A1, NO1 via a supplementary amplifier AMPL5. The peak detector circuits are connected between amplifiers AMPL0 and AMPL5. This enables the system to be independent of the voltage-sensitivity of current sources I5 to I8, as their common mode is no longer affected by voltage variations. This link becomes a virtual earth.

Another advantage lies in the fact that condensers CRH1 and CRL1 of the detector circuits are now connected to the output of amplifier AMPL0 and are no longer parasite elements for condenser C4.

This design implies the inversion of the RAMP signal in relation to that described in the first design.

Figure 7:
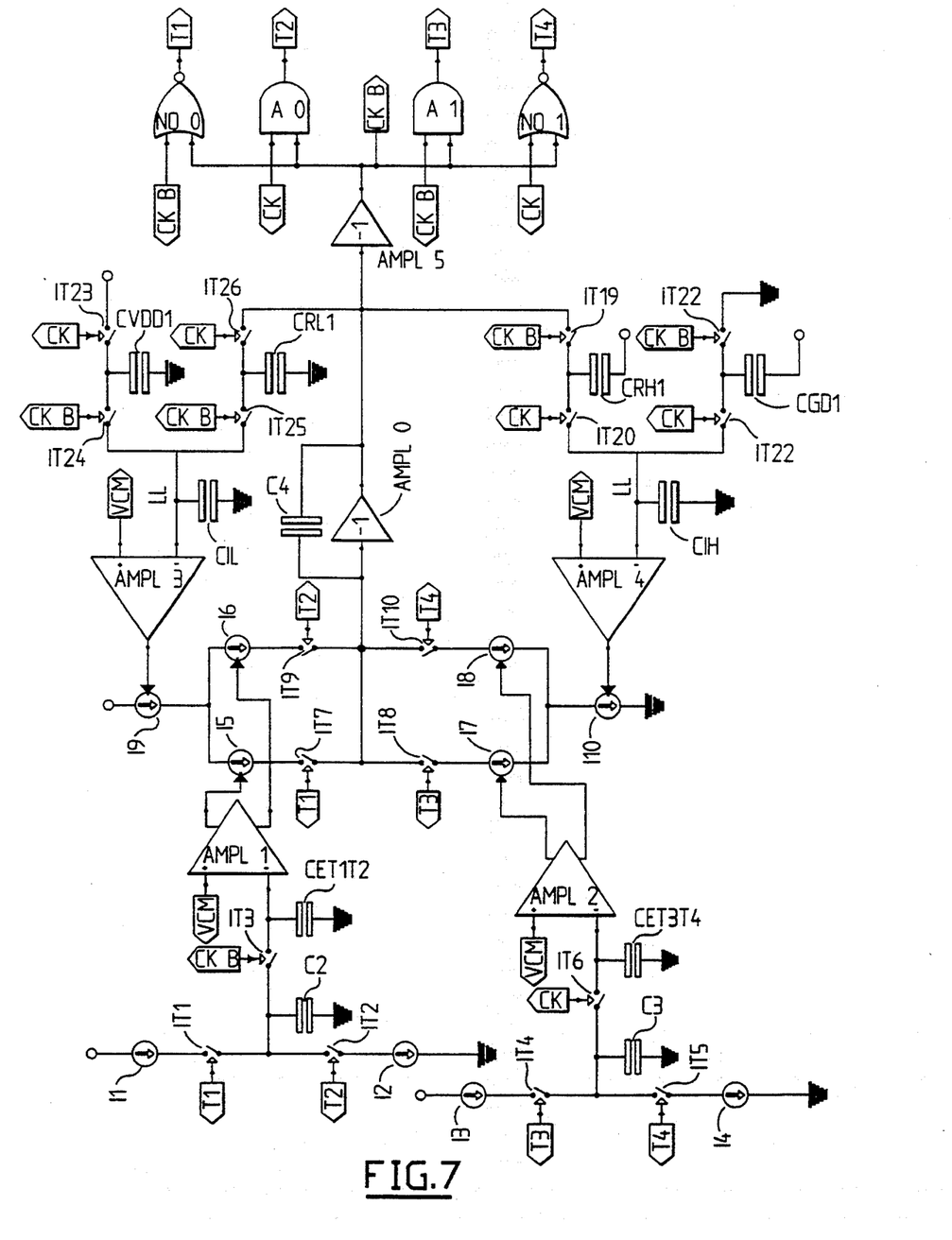
FIG. 7 is an electrical diagram of a second method of design of the phase shift circuit according to the invention.

FIG. 7 shows in particular that the peak detection circuit comprises a condenser CVDD1 connected between the supply voltage VDD and earth via a switch IT23 controlled by clock signal CK. Condenser CVDD1 is also connected to a first input of an amplifier AMPL3, a second input of which receives the reference signal VCM. To the first input of amplifier AMPL3 is connected a condenser CIL, also connected to earth.

To the output of amplifier AMPL0 is connected a condenser CRL1 via a switch IT26. Another switch IT25 connects this condenser to the first input of amplifier AMPL3.

Switches IT23 and IT26 are controlled by signals CK where switches IT24 and IT25 are controlled by signals CKB.

A similar design achieved by means of condensers CRH1 and CGD1, switches IT19, IT20, IT21, IT22 controlled by signals CKB, CK, CK and CKB respectively, and an amplifier AMPL4, controls source I10.

Figure 8:
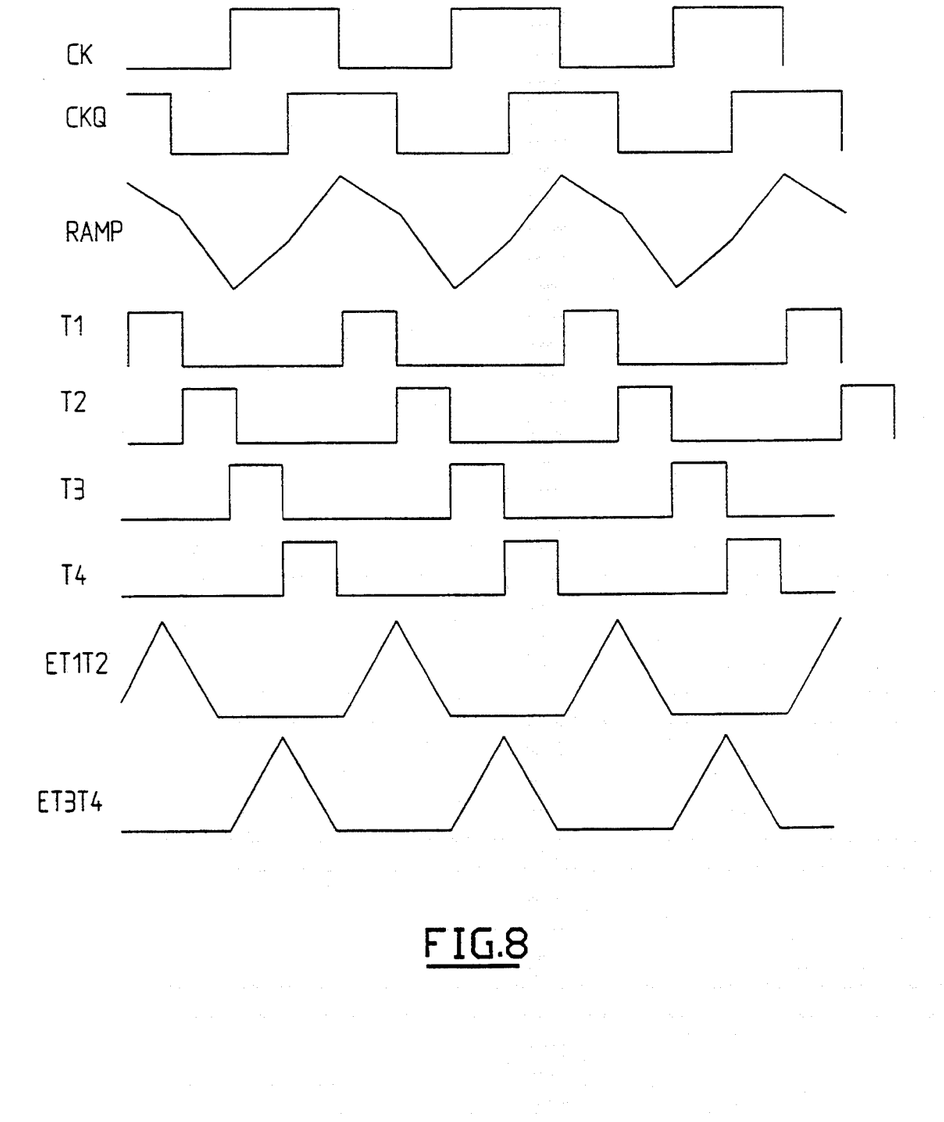
FIG. 8 shows a diagram as a function of time of the signals at various points of the circuit of FIG. 7.

Thus several control signals must be inverted as shown on the diagram in FIG. 8.

Figure 9:
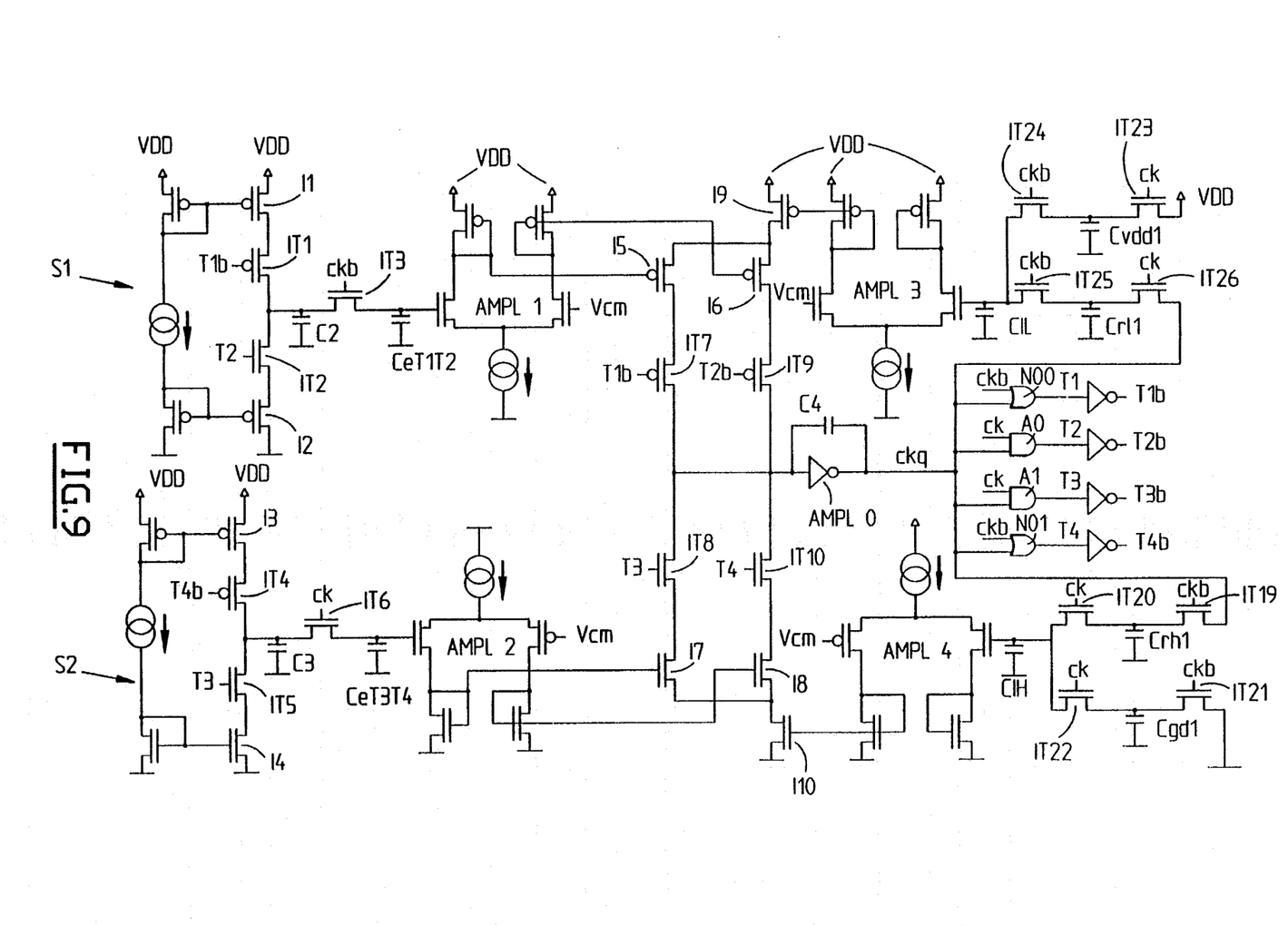
FIG. 9 shows a practical method of design of the device according to the invention.

FIG. 9 shows a possible design of the structure shown in FIG. 7 using CMOS devices.

The components of this circuit which correspond to those of the circuit in FIG. 7 bear the same reference numbers.

The circuit in FIG. 9 differs from that in FIG. 7 in that the CMOS transistors forming sources I1, I2 and I3, I4 are connected to stages of sources S1, S2 respectively.

Also to the outputs of gates NO0, A0, A1, NO1, are connected invertors INV1 to INV4 which invert the output signals T1 to T4 into signals T1B to T4B used to control the various components of the circuit.

The device which has just been described is particularly suitable for simple CMOS digital technology as it uses only components available in this type of technology.

The proposed structure used in standard digital CMOS technology allows the systematic creation of clock signals which have a well-defined phase shift. The cascading of several of these structures allows multiplication of the clock frequency and creates any phase relation between the phases of the said clock signals.

We claim:

1. A controlled delay digital clock signal generator circuit comprising:
    a. first circuitry to generate, from a clock signal and its clock signal, a single ramp signal comprising at least two segments of different positive slopes and at least two segments of different negative slopes wherein said slopes of each of said segments of said ramp signal are separately controlled;
    b. second circuitry for conversion of said ramp signal into a delayed square clock signal;
    c. third circuitry to provide logic combinations of said delayed square clock signal with said clock signal and with said complementary clock signal, to obtain as many delayed digital clock signals as said ramp signal has segments of different slopes.

2. The circuit of claim 1 wherein said first circuitry comprises:
    a. first, second, third and fourth current sources connected in series two by two between a supply voltage and earth;
    b. first switches connected in series between said first and said third current sources and second switches connected in series between said second and said fourth current sources, wherein each of said first and second switches is controlled by a different output of said third circuitry, said first switches and said second switches are connected by their terminals opposite said current sources to a first condenser;
    c. first and second differential amplifiers, each having an output, wherein said first and second current sources are controlled by said output of said first differential amplifier and said third and fourth current sources are controlled by said output of said second differential amplifier;
    d. a reference voltage connected to an input of said first differential amplifier and to an input of said second differential amplifier;
    e. a second condenser connected to an input of said first differential amplifier for integration of an error voltage resulting from a charge remaining in a third condenser;
    f. a switch activated by an output of said third circuitry corresponding to a first segment of positive slope of said ramp signal, connecting said third condenser to a fifth current source and a supply voltage in series;
    g. a switch activated by an output of said third circuitry corresponding to a second positive slope segment of said ramp signal, connecting said third condenser to a sixth current source in series to ground;
    h. a switch controlled by said complementary clock signal connecting said second condenser said third condenser;
    i. a fourth condenser connected to an input of said second differential amplifier for integration of an error voltage resulting from a charge remaining in a fifth condenser;
    j. a switch activated by an output of said third circuitry corresponding to a first segment of negative slope of said ramp signal, connecting said fifth condenser to a seventh current source and a supply voltage in series;
    k. a switch activated by an output of said third circuitry corresponding to a second negative slope segment of said ramp signal, connecting said fifth condenser to an eighth current source in series to ground; and
    l. a switch controlled by said clock signal connecting said fifth condenser said fourth condenser.

3. The circuit of claim 2, wherein said reference voltage is generated by a generator with switched capacity.

4. The circuit of claim 1, wherein said third circuitry comprises:
    a. a first and second AND gate, each having an input connected to said delayed square clock signal, said first AND gate having an input connected to said clock signal and said second AND gate having an input connected to said complementary clock signal; and
    b. a first and second NOR gate, each having an input connected to said delayed square clock signal, said first NOR gate having an input connected to said clock signal and said second NOR gate having an input connected to said complementary clock signal.

5. The circuit of claim 1, wherein said second circuitry comprising an amplifier.

6. The circuit of claim 7, further comprising means for stabilization of said delayed digital clock signal comprising:
    a. peak detector circuitry for detecting high and low peak values of the ramp signal;
    b. fourth circuitry for comparison of said high and low peak values with high and low reference voltages, respectively, to produce error signals for providing correction to said first circuitry.

7. The circuit of claim 6, wherein said peak detector circuitry comprises a circuit with switched capacities.

8. The circuit of claim 6, wherein said second circuitry comprising an amplifier.

* * * * *